United States Patent
McEachern

(10) Patent No.: US 9,581,618 B1
(45) Date of Patent: Feb. 28, 2017

(54) METHOD AND APPARATUS FOR TRIGGERED CAPTURE OF VOLTAGE PHASE ANGLE DATA ON AN ALTERNATING CURRENT POWER GRID

(75) Inventor: Alexander McEachern, Oakland, CA (US)

(73) Assignee: Power Standards Lab, Inc., Alameda, CA (US)

( * ) Notice: Subject to any disclaimer, the term of this patent is extended or adjusted under 35 U.S.C. 154(b) by 514 days.

(21) Appl. No.: 13/561,964

(22) Filed: Jul. 30, 2012

(51) Int. Cl.
- *G01R 21/00* (2006.01)
- *G01R 1/00* (2006.01)
- *G01R 19/25* (2006.01)
- *G01R 31/02* (2006.01)
- *H02J 3/24* (2006.01)
- *G01R 21/133* (2006.01)

(52) U.S. Cl.
CPC ........... *G01R 1/00* (2013.01); *G01R 19/2513* (2013.01); *G01R 21/133* (2013.01); *G01R 31/02* (2013.01); *H02J 3/24* (2013.01)

(58) Field of Classification Search
CPC .............. H02J 3/24; G01R 1/00; G01R 31/02
See application file for complete search history.

(56) References Cited

U.S. PATENT DOCUMENTS

| | | | | |
|---|---|---|---|---|
| 5,216,621 A | * | 6/1993 | Dickens | 702/58 |
| 2008/0204054 A1 | * | 8/2008 | Wells | 324/713 |
| 2013/0064178 A1 | * | 3/2013 | Cs et al. | 370/328 |
| 2013/0073105 A1 | * | 3/2013 | Schmid et al. | 700/295 |

* cited by examiner

*Primary Examiner* — Matthew G Marini
(74) *Attorney, Agent, or Firm* — Lessani Law Group, PC

(57) ABSTRACT

A method and apparatus are provided for capturing voltage phase angle data on an alternating current power grid. The method includes periodically making a voltage phase angle measurement at each of a plurality of locations on the alternating current power grid relative to a timing reference signal (e.g., a GPS timing signal) that is available at each location. For each of the locations, the voltage phase angle measurements are stored locally at the location. A trigger event is selected that will be simultaneously detectable at two or more of the locations. The method includes monitoring for the trigger event at each of the plurality of locations. In response to detecting the trigger event at one or more of the locations, a select amount of pre-trigger and post-trigger measurements are transmitted over a data communications network to a pre-designated destination from each location at which the trigger event was detected.

15 Claims, 5 Drawing Sheets

FIG. 3 - PRIOR ART

METHOD AND APPARATUS FOR TRIGGERED CAPTURE OF VOLTAGE PHASE ANGLE DATA ON AN ALTERNATING CURRENT POWER GRID

BACKGROUND OF THE INVENTION

1. Field of the Invention

This invention relates generally to an alternating current power grid system and, more particularly, a method and apparatus for capturing voltage phase angle data on an alternating current power grid.

2. Description of the Background Art

In the background art it is well known that useful information about the state of an alternating current (AC) power grid can be obtained by measuring the phase angle between the voltages at different locations. In the background art, these locations are typically on the high-voltage bulk power transmission section of an AC power grid. The information obtained by such measurements can include information about power flow in complex grids, information about grid stability, and information that is useful for operating protective devices on an AC power grid. This information can be used to improve the reliability and efficiency of an AC power grid.

Typically, these angles are measured using Phasor Measurement Units (PMUs). A PMU is an electronic device that processes analog voltage waveform data at a location on the power grid in order to measure voltage phase angle at that location. PMUs are typically installed at multiple locations in order to measure the voltage phase angles between those locations. The voltage phase angle at each location is initially measured relative to a common timing reference, typically a Global Positioning System (GPS) timing reference signal. PMUs typically produce measurements at a rate between 60 measurements per second and 1 measurement per second that must immediately be sent to one or more Phasor Data Concentrators in real time for comparison to angles transmitted by other PMUs. Such a system inherently requires a high-reliability, high-bandwidth data transmission connection between the PMUs and the Phasor Data Concentrator. Due to the resource-intensive nature of such a phasor monitoring system that includes a high-reliability, high-bandwidth data transmission connection, utility companies have economically justified the use of PMUs only on the transmission system of the power grid where the flow of power has a very high economic value, but not on distribution systems or low-voltage systems where smaller amounts of power flow occur.

In recent years, it has been observed that some disruptions to the power grid have resulted in increasing instability on the power grid (i.e., greater phase angle oscillation swings between remote locations on the grid). One theory is that the growing number of small power generators (e.g., photovoltaic solar panels, home-based wind turbines, fuel cells, electric vehicle energy storage systems) on the power grid may be causing at least a portion of this increased instability, but more study is required to determine the validity of this theory.

Small power generators such as photovoltaic arrays, wind turbines, and fuel cells may sometimes be located within distribution systems or low-voltage systems of the power grid. In order to determine the effect of these generators on the stability of the AC power grid, it would be useful to obtain voltage phase angle data from locations within distribution and low-voltage systems. As discussed above, known PMUs require high-data, high-bandwidth networks to transmit voltage phase angle data, and it is economically difficult to justify the resources required to install such networks within distribution systems or low-voltage systems. Nevertheless, with the proliferation of photovoltaic solar panels, home-based wind turbines, fuel cells, and electric vehicle energy storage systems, there is an increasing need for voltage phase angle data from locations within distribution and low-voltage systems.

SUMMARY OF THE INVENTION

The present invention is directed to a method and apparatus for capturing voltage phase angle data at two or more locations on an alternating current power grid.

Advantages of the present invention include the elimination of the requirement for expensive high-reliability, high-bandwidth communication channels and the ability to minimize the required amount of data to be transferred.

The method includes periodically making a voltage phase angle measurement at each of a plurality of locations on the alternating current power grid relative to a timing reference signal (e.g., a GPS timing signal) that is available at each location. The voltage phase angle measurements are stored locally at each of the locations. The method includes monitoring for a trigger event at each of the plurality of locations, wherein the trigger event selected for monitoring is an event that, when occurring, will be detectable at two or more of the locations within a select number (e.g., 12) of alternating current cycles. When a trigger event is detected at a location, a select amount of pre-trigger and post-trigger voltage phase angle measurements are sent from the location to a pre-designated destination. The voltage phase angle measurements may be transmitted over a data communications network. Because measurements are stored locally and transmitted only in response to a trigger event, a slower, less reliable (and less expensive) data communication network than that required for the prior art PMUs on the transmission line will suffice for the present invention. In certain embodiments, the above-referenced locations are locations within distribution systems and/or low-voltage systems.

In certain embodiments, the alternating current power grid has a frequency, and the trigger event is when the frequency exceeds or falls below a predetermined threshold or when the frequency exceeds a predetermined frequency rate-of-change. The trigger event may be a power quality disturbance, such as a voltage sag, or a voltage swell, or a change in voltage waveform, or it may be a predetermined time or time interval.

In certain embodiments, the method further includes calculating relative voltage phase angles at points in time before the trigger event, during the trigger event, and after the trigger event between at least two of the locations at which the trigger event is detected.

In certain embodiments, transmitting the pre-trigger and post-trigger measurements comprises automatically generating an email message with the pre-trigger and post-trigger measurements and sending the email message to a pre-designated destination.

The apparatus includes a voltage phase angle measuring circuit operatively coupled to the alternating current power grid that periodically measures a voltage phase angle on the alternating current power grid relative to a timing reference signal (e.g., a GPS timing signal). The voltage phase angle measuring circuit includes a microprocessor that monitors for a trigger event. In response to detecting the trigger event, a message is generated with a select amount of pre-trigger and post trigger voltage phase angle measurements. The trigger event is selected so that it is an event that will be detectable at two or more locations. The apparatus also includes a storage device operatively coupled to the voltage phase angle measuring circuit capable of storing voltage phase angle measurements, and a data communications network interface operatively coupled to the voltage phase angle measuring circuit that transmits the message to a pre-designated destination over the data communications network.

DETAILED DESCRIPTION OF THE PREFERRED EMBODIMENTS

The present invention provides a method and apparatus for capturing voltage phase angle data on an alternating current power grid.

Figure 1:
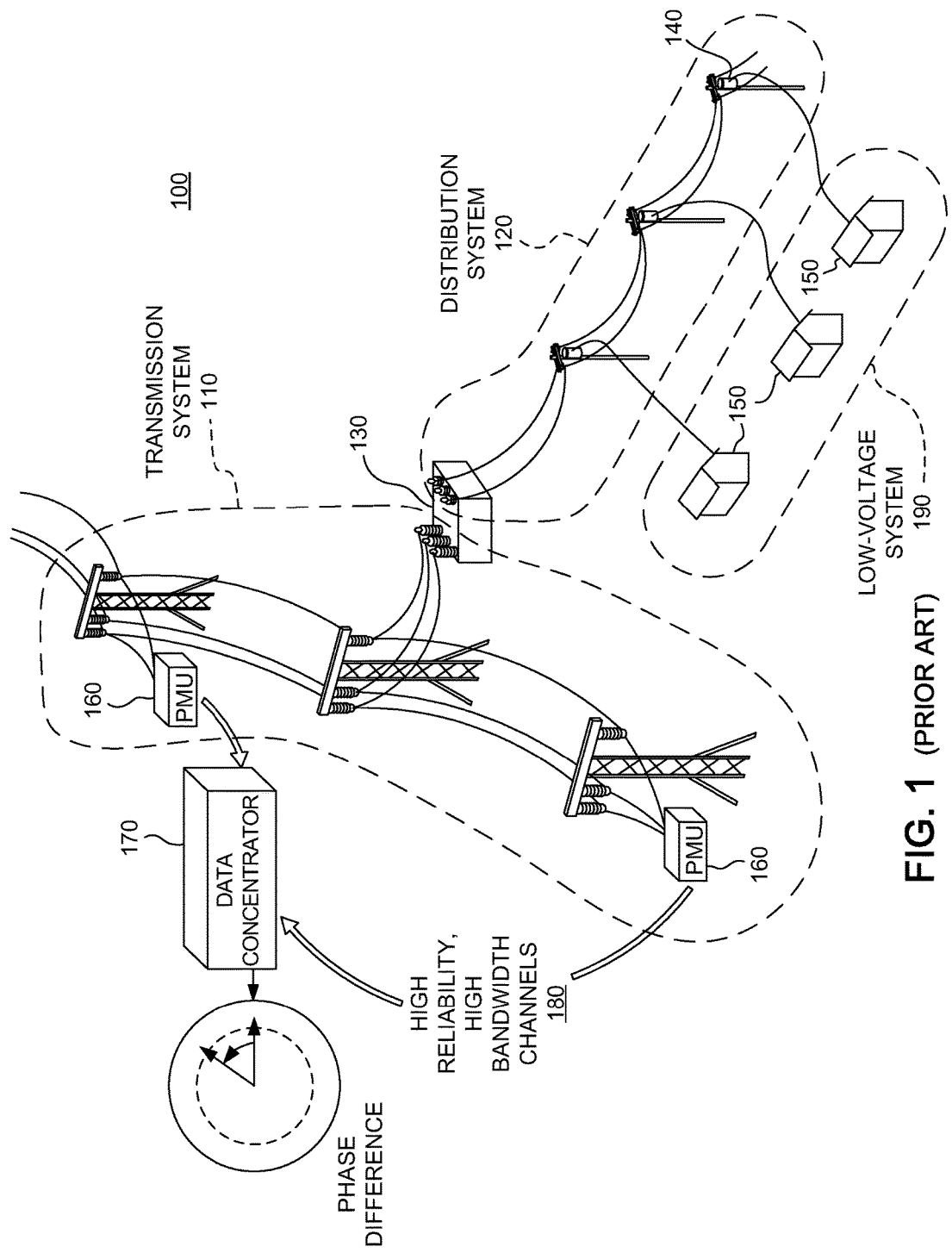
FIG. 1 is a schematic representation of a power grid system according to the prior art.

As would be understood by a person of skill in the art, FIG. 1 shows an exemplary alternating current power grid system 100, which moves power from generators to loads. Power grid system 100 has a transmission system 110, which typically uses voltages greater than 100 kilovolts (kV) (e.g., 330 kV) and transmits power over distances in the general range of tens to hundreds of kilometers. The transmission system 110 is connected to a distribution system 120 via a substation transformer 130 that steps down the voltage. The distribution system 120 typically uses voltages between 1 kV and 100 kV (e.g., 24 kV) and moves power over distances in the general range of one to tens of kilometers. The distribution system 120 is connected to a low-voltage system 190 via pad-mounted or pole-mounted low-voltage transformers 140. The low-voltage system carries power over distances in the general range of one to hundreds of meters to individual homes and businesses 150 and typically uses voltages below 1 kV (e.g., 120V/240V).

In prior art on a typical power grid system 100, two or more phasor measuring units (PMUs) 160 are placed on the transmission system 110 to measure the voltage phase angle at each of their locations. The PMUs are connected via high-reliability, high-bandwidth channels 180 to one or more phasor data concentrators (PDCs) 170, which determine the phase angle difference between each of the locations. These channels may include fiber optic cables, Ethernet connections, or wireless networks. In general, these channels are expensive and often unavailable, or available only with severe constraints, at locations outside of electric power substations.

Figure 2:
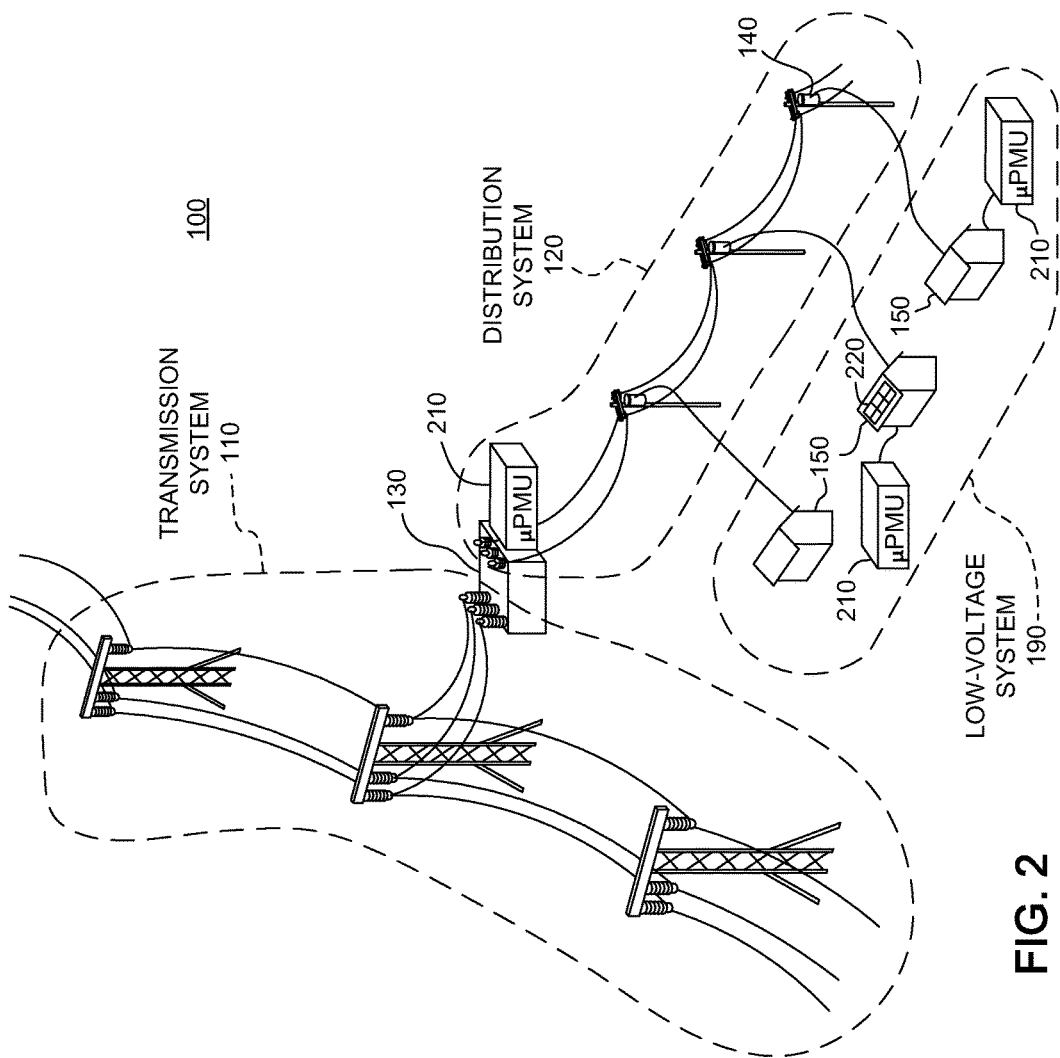
FIG. 2 is a schematic representation of a power grid system according to one embodiment of the invention, drawn in such a way as to conveniently contrast with the prior art of FIG. 1.

FIG. 2 illustrates one embodiment of the present invention in which micro phasor measuring units (μPMUs) 210 that do not require high-reliability, high-bandwidth network connections are added to the distribution system 120 and the low-voltage system 190. Unlike the prior art, these μPMUs 210 provide data regarding phase angle measurements at the distribution system 120 and individual home and business 150 locations. For example, a μPMU 210 may be installed at a home 150 with a photovoltaic solar panel 220. The data from μPMUs 210 may, along with the data from the transmission system 110, provide useful information for analyzing and resolving power grid system 100 instability. As can be seen in FIG. 2, the μPMUs 210 may be installed on the substation transformer 130, on the distribution system 120 power poles (not shown), on individual homes and businesses 150, or at other locations on the transmission, distribution, or low voltage sections of an electric power grid.

Figure 3:
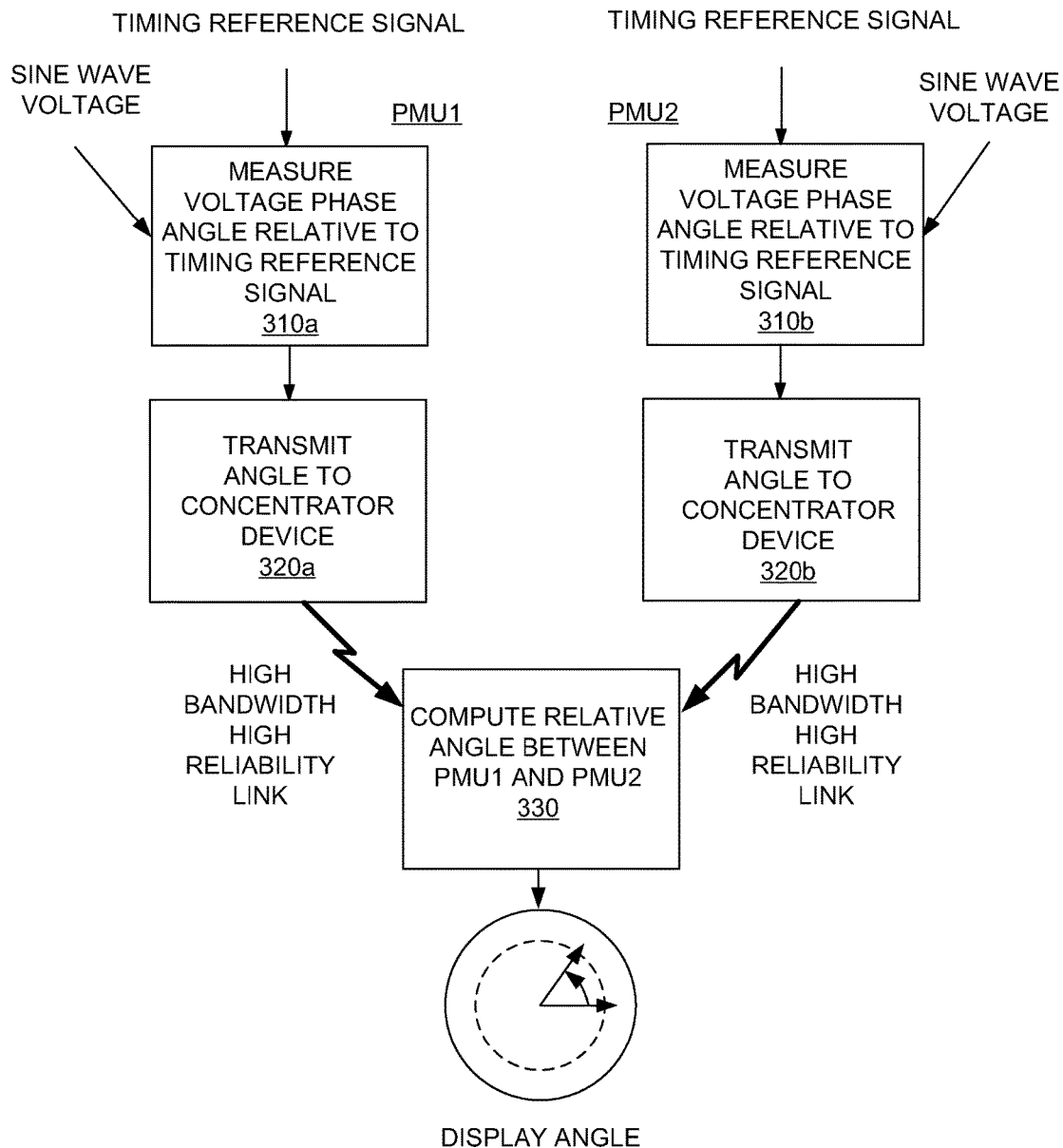
FIG. 3 is a flowchart that illustrates a prior art method for capturing voltage phase angle data at two or more locations on an alternating current power grid.

FIG. 3 illustrates a prior art method for obtaining the relative phase angle between two PMUs, PMU1 and PMU2, that are installed at different locations on the transmission system 110 of power grid system 100 shown in FIG. 1. Turning our attention first to PMU1, the voltage phase angle is measured at a first location relative to a timing reference signal (e.g., a GPS timing signal) (step 310a). The voltage phase angle is transmitted in substantially real-time to a Phasor Data Concentrator device via a high-reliability, high-bandwidth data link (step 320a). Turning our attention to PMU2, the voltage phase angle is measured at a second location relative to a timing reference signal (step 310b). The voltage phase angle is transmitted in substantially real-time to a Phasor Data Concentrator via the high-reliability, high-bandwidth data link (step 320b). At the Phasor Data Concentrator, the relative angle between PMU1 and PMU2 is computed, displayed, or otherwise processed (step 330). The relative angle data may be used to control generators and other devices on the grid. Measurements are typically made and transmitted by PMUs either every 60 hertz cycle, or several times per second.

The prior art PMUs, and the corresponding method illustrated in FIG. 3, are designed for control systems that require near instantaneous responses to phase angle changes. As stated above, this method requires an expensive, fast, and reliable communication channel that is too costly to install throughout distribution systems and low-voltage systems.

Figure 4:
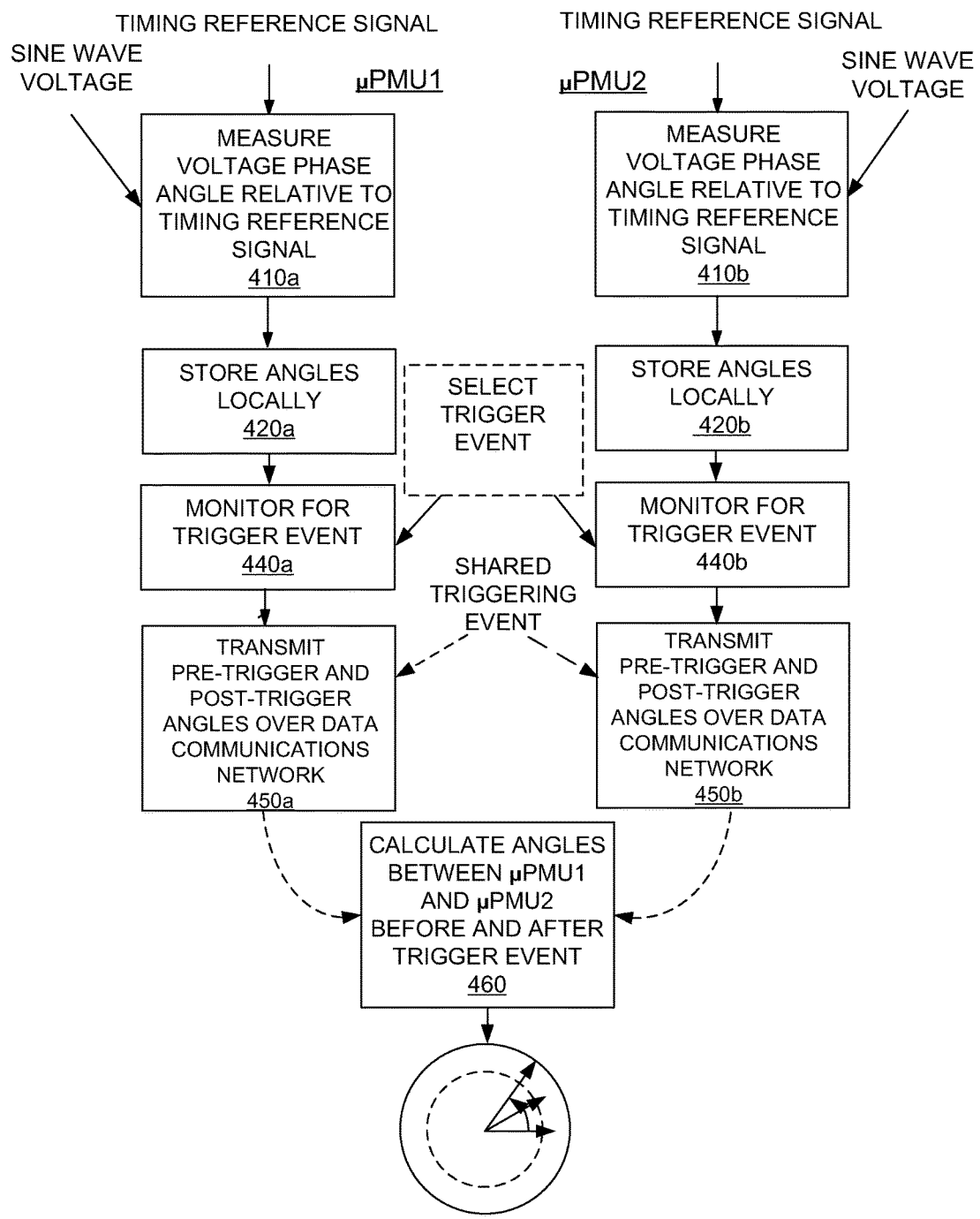
FIG. 4 is a flowchart that illustrates a method for capturing voltage phase angle data at two or more locations on an alternating current power grid according to one embodiment of the invention.

FIG. 4 illustrates a contrasting method, according to one embodiment of the present invention, for obtaining the relative phase angle between two locations on the power grid system 100. FIG. 4 is described with respect to two μPMUs, μPMU1 and μPMU2, that are installed at two different locations on the distribution system 120 or low-voltage system 190 of power grid system 100 shown in FIG. 2. The locations are locations at which a data communication network is available, but such data communication network can be a slower, less reliable network than that required in prior art.

Both μPMU1 and μPMU2 periodically measure a voltage phase angle at their respective location on the alternating current power grid (steps 410a, 410b). The measurements are made relative to a timing reference signal that is universally available (or at least available at each of the locations). In the preferred embodiment, the timing reference signal is a GPS timing signal from a GPS satellite. Instead of transmitting the measurements in real-time to a PDC, each μPMU stores its measurements locally (steps 420a, 420b). Measurements are stored with a time stamp derived from the timing reference signal.

Both μPMU1 and μPMU2 also monitor for a trigger event (steps 440a, 440b). As a phase angle only has meaning if it is measured between two different locations, a trigger event is selected that, when occurring, would be simultaneously, or near simultaneously (e.g., within 12 alternating current cycles) detectable at both μPMU1 and μPMU2. In one embodiment, the trigger event is selected prior to the installation of the μPMUs, and the μPMUs are configured to monitor for the trigger event during the μPMU manufacturing process. In certain embodiments, the μPMUs may be reprogrammed at a later time to monitor for a different or additional trigger event or events.

In certain embodiments, the trigger event is when the frequency of the alternating current power grid exceeds or falls below a predetermined threshold, or exceeds a predetermined frequency rate-of-change. In certain embodiments, the trigger event is the crossing of a selected power quality threshold, such as a voltage sag threshold, a voltage swell threshold, a waveform change threshold, an impulse threshold, or any other power quality thresholds. In certain embodiments, the trigger event is a power quality disturbance. In certain embodiments, the trigger event may be a predetermined time or time interval.

In response to detecting the shared trigger event, each μPMU transmits a select amount of pre-trigger and post-trigger measurements to a pre-designated destination (steps 450a, 450b). For example, the μPMUs may transmit any measurements made in the one minute prior to the trigger event and the five minutes after the trigger event. The measurements are transmitted over a data communications network. In one embodiment, in response to detecting a trigger event, each μPMU sends an email message with the select amount of pre-trigger and post-trigger measurements to the pre-designated destination. In certain embodiments, the μPMUs may monitor for several trigger events and transmit pre-trigger and post-trigger measurements in response to detecting any one of the trigger events.

For simplicity, the measure, store, and monitor steps are displayed serially in FIG. 4. However, the monitor step will typically be performed in parallel with the measure and store steps, and the invention is not limited to the specific order of steps shown in FIG. 4.

In response to receiving the trigger-related measurements, a computer at the pre-designated destination calculates relative phase angles between μPMU1 and μPMU2 before, during, and after the trigger event (step 460). For example, an email client program with additional phase-angle calculation software may automatically perform these calculations in response to receiving trigger-related measurements from μPMUs at two or more locations. The received trigger-related measurements from μPMU1 and μPMU2 are synchronized using their respective time stamps so that measurements taken at the same time on both devices can be compared. The relative angles may be recorded, may be processed for further analysis, or may be used to control generators and other devices on the grid (although not in real-time). In one embodiment, when a trigger notice is received from a μPMU at the pre-designated destination, the computer may identify all other μPMUs that also detected the trigger event at substantially the same time, and compare relative phases angles between all such μPMUs.

Because measurements are stored locally and transmitted only in response to a trigger event, a slower, less reliable (and less expensive) data communication network than that required for the prior art PMUs on the transmission line suffices for the μPMUs of the present invention. If the data communication network is unavailable when a μPMU detects a trigger event, it will transmit the select amount of pre-trigger and post-trigger measurements whenever the data communication network becomes available again. Measurements are locally stored for a duration that is at least equal to the select amount of pre-trigger measurements required, and are preferably stored for a duration that exceeds the maximum expected downtime of the data communication network. In one embodiment, the measurements are stored in a storage device within the μPMU that is capable of storing the measurements for at least twenty-four hours.

Figure 5:
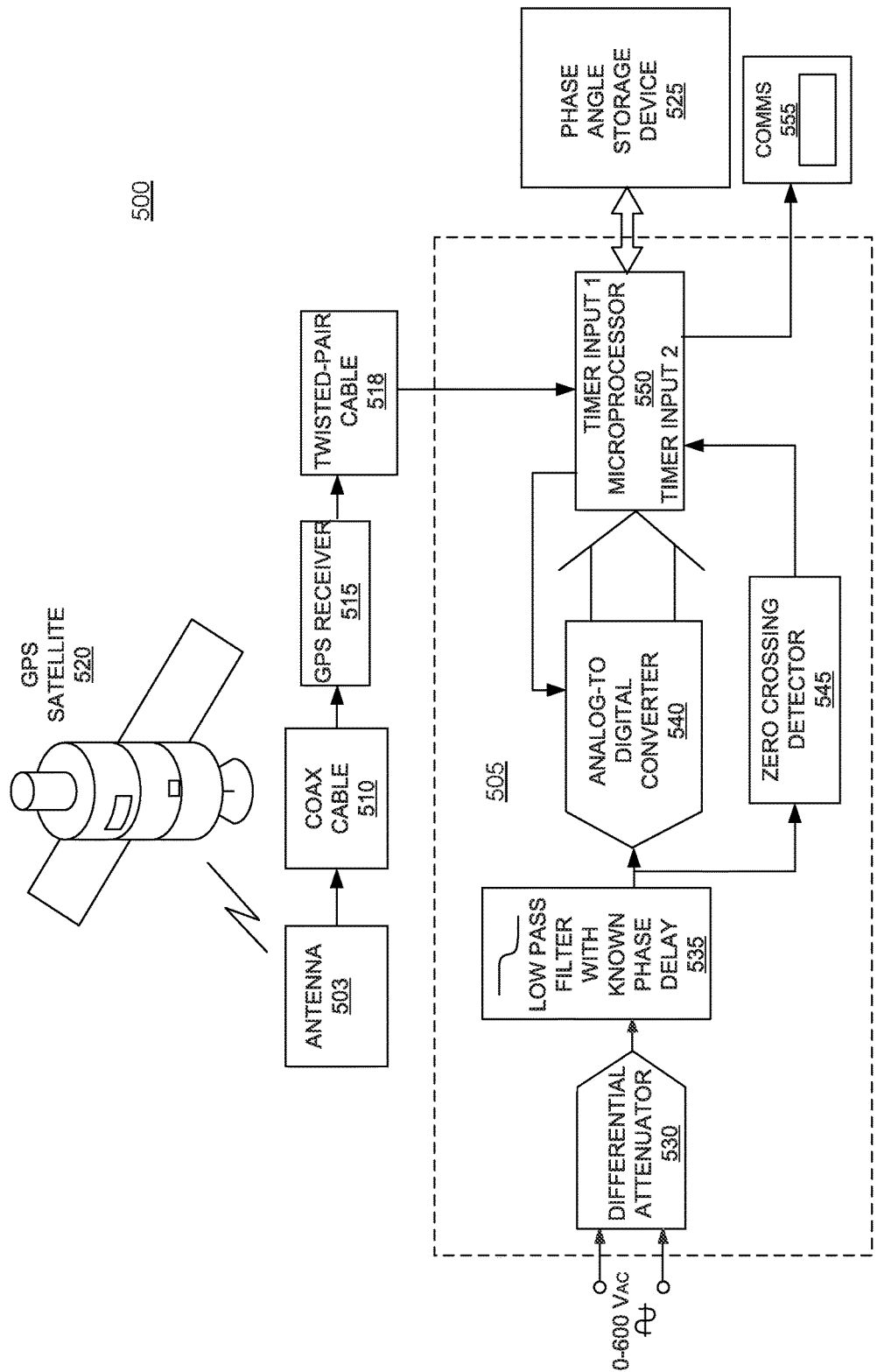
FIG. 5 is a block diagram of a voltage phase angle measuring system according to one embodiment of the invention.

FIG. 5 illustrates an exemplary voltage phase angle measuring system 500 (i.e., a μPMU) according to one embodiment of the invention. As a person skilled in the art would understand, the voltage phase angle measuring system 500 may be constructed in any number of ways within the scope of the present invention. The method of FIG. 4 may be implemented in other systems, and the invention is not limited to system 500.

Voltage phase angle measuring system 500 includes a voltage phase angle measuring circuit 505 coupled to an alternating current power grid and connected via a twisted-pair cable 518 to a timing reference signal receiver 515 (e.g., a GPS timing receiver). The timing reference signal receiver 515 is coupled via a coaxial cable 510 to an antenna 503, which receives a timing reference signal from a satellite 520 (e.g., a GPS satellite). The voltage phase angle measuring circuit 505 is also connected with a phase angle storage device 525, which is able to store phase angle data for at least twenty-four hours, at least one week, at least one month, at least one year, etc.

The voltage phase angle measuring circuit 505 has a differential attenuator 530, a low pass filter with known phase delay 535, an analog-to-digital converter 540, a zero crossing detector 545, and a microprocessor 550. The differential attenuator 530 reduces the signal to a typical electronic analog signal level (e.g., +/−10V). The low pass filter 535 with known phase delay extracts the fundamental waveform and serves as an anti-alias filter for the subsequent analog-to-digital converter 540. The analog-to-digital converter 540 converts the analog signal to a digital representation of the analog signal, and the zero crossing detector 545 converts the analog signal to a digital timing signal. The output signals from the analog-to-digital converter 540 and the zero crossing detector 545 are applied to the microprocessor 550. The microprocessor 550 processes these signals relative to the timing reference signal (i.e., the GPS timing signal) received from the GPS receiver 515 via the twisted-pair cable 518. Specifically, the microprocessor 550 uses the signal from the zero crossing detector 545, the signal from the GPS receiver 515, and the signal from the analog-to-digital converter 540 to measure the phase angle between the voltage and the timing reference signal. In making the measurement, the microprocessor 550 may calibrate the timing reference signal to account for delays in transmitting the timing reference signal from the antenna 503 to the voltage phase angle measuring circuit 505. The resulting voltage phase angle measurement is then outputted to and stored by the phase angle storage device 525, which, in the preferred embodiment, has the capability to store measurements for twenty-four hours or more.

The microprocessor 550 also monitors for a trigger event, which is selected to be detectable at two or more locations, and, in response to detecting the trigger event, generates a message with a select amount of pre-trigger and post-trigger voltage angle measurements. Software executing on the microprocessor enables the microprocessor to calculate the phase angle measurements and monitor for trigger events.

The voltage phase angle measuring circuit 505 is operatively coupled to a data communication network interface 555 that will transmit the message from μPMUs at one or more locations over a data communications network (e.g., Ethernet, wireless, etc.) to a pre-designated destination in response to detecting the trigger event at the one or more locations.

The GPS signal received at the GPS receiver 515 may be a precision pulse-per-second timing signal from one or more satellites. Such a pulse-per-second timing signal is aligned in time at all GPS receivers within approximately 1 microsecond, which corresponds to approximately 0.02 degrees on a 60 hertz signal.

As will be understood by those familiar with the art, the invention may be embodied in other specific forms without departing from the spirit or essential characteristics thereof. Accordingly, the above disclosure of the present invention is intended to be illustrative and not limiting of the invention.

The invention claimed is:

1. A method for capturing select pre-trigger and post-trigger voltage phase angle measurement data at two or more locations on an alternating current power grid, the method comprising:
    selecting a trigger event with characteristics such that, when it occurs, the trigger event (a) will be detectable at two or more locations simultaneously within a select number of alternating current cycles, such select number being equal to or less than twelve and (b) will produce a select amount of pre-trigger and post-trigger voltage phase angle measurements at each of the two or more locations;
    periodically making a voltage phase angle measurement at each of a plurality of locations on the alternating current power grid relative to a timing reference signal that is available at each location;
    for each of the locations, storing the voltage phase angle measurements locally at the location;
    monitoring for the trigger event at each of the plurality of locations;
    detecting the trigger event at the two or more locations simultaneously within the select number of alternating current cycles; and
    for each of the locations at which the trigger event was detected simultaneously, transmitting the select amount of pre-trigger and post-trigger voltage phase angle measurements to a pre-designated destination in response to detecting the trigger event at the location, wherein the voltage phase angle measurements are transmitted over a data communications network.

2. The method of claim 1, further comprising:
    calculating relative voltage phase angles at points in time before the trigger event, during the trigger event, and after the trigger event between at least two of the locations at which the trigger event was detected.

3. The method of claim 1, wherein the alternating current power grid includes a transmission system, a distribution system, and a low-voltage system, and wherein the plurality of locations are in the distribution system or low-voltage system.

4. The method of claim 1, wherein the alternating current power grid has a frequency, and the trigger event is when the frequency exceeds or falls below a predetermined threshold.

5. The method of claim 1, wherein alternating current power grid has a frequency, and the trigger event is when the frequency exceeds a predetermined frequency rate-of-change.

6. The method of claim 1, wherein the trigger event is a power quality disturbance.

7. The method of claim 1, wherein the trigger event is a predetermined time or time interval.

8. The method of claim 1, wherein transmitting the pre-trigger and post-trigger measurements comprises automatically generating an email message with the pre-trigger and post-trigger measurements and sending the email message to the pre-designated destination.

9. A system for capturing select pre-trigger and post-trigger voltage phase angle measurement data on an alternating current power grid, the system comprising:
    two or more voltage phase angle measuring circuits, operatively coupled to the alternating current power grid at two or more locations, wherein each voltage phase angle measuring circuit periodically measures a voltage phase angle on the alternating current power grid relative to a timing reference signal and wherein each voltage phase angle measuring circuit includes a microprocessor that monitors for a trigger event selected with characteristics such that, when it occurs, the trigger event (a) will be detectable at two or more locations simultaneously within a select number of alternating current cycles, such select number being equal to or less than twelve and (b) will produce a select amount of pre-trigger and post-trigger voltage phase angle measurements at each of the two or more locations, and, in response to detecting the trigger event, generates a message with the select amount of pre-trigger and post-trigger voltage phase angle measurements; and
    a storage device operatively coupled to each of the two or more voltage phase angle measuring circuits capable of storing voltage phase angle measurements; and
    a data communications network interface operatively coupled to each of the two or more voltage phase angle measuring circuits that transmits the message to a pre-designated destination over the data communications network.

10. The system of claim 9, wherein the alternating current grid has a frequency, and the trigger event is when the frequency exceeds or falls below a predetermined threshold.

11. The system of claim 9, wherein alternating current power grid has a frequency, and the trigger event is when the frequency exceeds a predetermined frequency rate-of-change.

12. The system of claim 9, wherein the trigger event is a power quality disturbance.

13. The system of claim 9, wherein the trigger event is a predetermined time or time interval.

14. The method of claim 1, wherein the timing reference signal is a GPS timing signal.

15. The system of claim 9, wherein the timing reference signal is a GPS timing signal.

* * * * *